US009236352B2

(12) United States Patent
Pagaila et al.

(10) Patent No.: US 9,236,352 B2
(45) Date of Patent: Jan. 12, 2016

(54) SEMICONDUCTOR DIE AND METHOD OF FORMING NOISE ABSORBING REGIONS BETWEEN THVS IN PERIPHERAL REGION OF THE DIE

(75) Inventors: Reza A. Pagaila, Singapore (SG); Byung Tai Do, Singapore (SG); Shuangwu Huang, Singapore (SG); Nathapong Suthiwongsunthorn, Singapore (SG); Dioscoro Merilo, Singapore (SG)

(73) Assignee: STATS ChipPAC, Ltd., Singapore (SG)

( * ) Notice: Subject to any disclaimer, the term of this patent is extended or adjusted under 35 U.S.C. 154(b) by 98 days.

(21) Appl. No.: 13/334,556

(22) Filed: Dec. 22, 2011

(65) Prior Publication Data

US 2012/0091567 A1    Apr. 19, 2012

Related U.S. Application Data

(62) Division of application No. 12/404,069, filed on Mar. 13, 2009, now Pat. No. 8,093,151.

(51) Int. Cl.
*H01L 23/552* (2006.01)
*H01L 21/56* (2006.01)
(Continued)

(52) U.S. Cl.
CPC ............ *H01L 23/552* (2013.01); *H01L 21/565* (2013.01); *H01L 21/568* (2013.01); *H01L 21/6835* (2013.01); *H01L 23/3128* (2013.01); *H01L 23/49805* (2013.01);
(Continued)

(58) Field of Classification Search
CPC ............... H01L 23/552; H01L 2924/3025; H01L 2924/01078; H01L 2924/14; H01L 21/565; H01L 21/568; H01L 21/6835; H01L 23/3128; H01L 23/49805; H01L 23/49827; H01L 23/5389; H01L 23/66; H01L 25/0657; H01L 24/03; H01L 24/05; H01L 24/08; H01L 24/96; H01L 25/50; H01L 2221/68336
USPC ................. 257/659, 774, 734, 777, 724, 725, 257/E23.114; 438/731, 667, 629, 675
See application file for complete search history.

(56) References Cited

U.S. PATENT DOCUMENTS 5,587,119 A * 12/1996 White ........................ 264/104
5,639,989 A * 6/1997 Higgins, III .................. 174/386
(Continued)

FOREIGN PATENT DOCUMENTS

TW     200849547 A    12/2008

*Primary Examiner* — Thinh T Nguyen
(74) *Attorney, Agent, or Firm* — Robert D. Atkins; Patent Law Group: Atkins and Associates, P.C.

(57) ABSTRACT

A semiconductor wafer has a plurality of semiconductor die. A peripheral region is formed around the die. An insulating material is formed in the peripheral region. A portion of the insulating material is removed to form a through hole via (THV). A conductive material is deposited in the THV to form a conductive THV. A conductive layer is formed between the conductive THV and contact pads of the semiconductor die. A noise absorbing material is deposited in the peripheral region between the conductive THV to isolate the semiconductor die from intra-device interference. The noise absorbing material extends through the peripheral region from a first side of the semiconductor die to a second side of the semiconductor die. The noise absorbing material has an angular, semi-circular, or rectangular shape. The noise absorbing material can be dispersed in the peripheral region between the conductive THV.

32 Claims, 13 Drawing Sheets

(51) Int. Cl.
*H01L 21/683* (2006.01)
*H01L 23/31* (2006.01)
*H01L 23/498* (2006.01)
*H01L 23/538* (2006.01)
*H01L 23/66* (2006.01)
*H01L 25/065* (2006.01)
*H01L 25/00* (2006.01)
*H01L 23/00* (2006.01)

(52) U.S. Cl.
CPC ..... *H01L 23/49827* (2013.01); *H01L 23/5389* (2013.01); *H01L 23/66* (2013.01); *H01L 24/03* (2013.01); *H01L 24/05* (2013.01); *H01L 24/08* (2013.01); *H01L 24/96* (2013.01); *H01L 25/0657* (2013.01); *H01L 25/50* (2013.01); *H01L 24/48* (2013.01); *H01L 2221/68336* (2013.01); *H01L 2224/0239* (2013.01); *H01L 2224/02122* (2013.01); *H01L 2224/02311* (2013.01); *H01L 2224/02372* (2013.01); *H01L 2224/02375* (2013.01); *H01L 2224/0401* (2013.01); *H01L 2224/04042* (2013.01); *H01L 2224/04105* (2013.01); *H01L 2224/05009* (2013.01); *H01L 2224/05548* (2013.01); *H01L 2224/05552* (2013.01); *H01L 2224/05554* (2013.01); *H01L 2224/05611* (2013.01); *H01L 2224/05624* (2013.01); *H01L 2224/05639* (2013.01); *H01L 2224/05644* (2013.01); *H01L 2224/05647* (2013.01); *H01L 2224/05655* (2013.01); *H01L 2224/08145* (2013.01); *H01L 2224/48* (2013.01); *H01L 2224/96* (2013.01); *H01L 2225/06513* (2013.01); *H01L 2225/06541* (2013.01); *H01L 2924/0103* (2013.01); *H01L 2924/014* (2013.01); *H01L 2924/01005* (2013.01); *H01L 2924/01006* (2013.01); *H01L 2924/01013* (2013.01); *H01L 2924/01029* (2013.01); *H01L 2924/01033* (2013.01); *H01L 2924/01047* (2013.01); *H01L 2924/01073* (2013.01); *H01L 2924/01078* (2013.01); *H01L 2924/01079* (2013.01); *H01L 2924/01082* (2013.01); *H01L 2924/01322* (2013.01); *H01L 2924/12041* (2013.01); *H01L 2924/1306* (2013.01); *H01L 2924/13091* (2013.01); *H01L 2924/14* (2013.01); *H01L 2924/1433* (2013.01); *H01L 2924/19041* (2013.01); *H01L 2924/19042* (2013.01); *H01L 2924/19043* (2013.01); *H01L 2924/3011* (2013.01); *H01L 2924/3025* (2013.01); *H01L 2924/30105* (2013.01)

(56) References Cited

U.S. PATENT DOCUMENTS

| | | | | |
|---|---|---|---|---|
| 6,122,187 | A  * | 9/2000 | Ahn et al. | 365/63 |
| 6,379,982 | B1 | 4/2002 | Ahn et al. | |
| 6,476,331 | B1 | 11/2002 | Kim et al. | |
| 6,717,071 | B2 * | 4/2004 | Chang et al. | 174/266 |
| 6,737,750 | B1 | 5/2004 | Hoffman et al. | |
| 6,743,696 | B2 * | 6/2004 | Jeung et al. | 438/458 |
| 6,933,600 | B2 * | 8/2005 | Wu et al. | 257/691 |
| 7,001,825 | B2 | 2/2006 | Halahan et al. | |
| 7,157,372 | B1 * | 1/2007 | Trezza | 438/675 |
| 7,307,348 | B2 * | 12/2007 | Wood et al. | 257/774 |
| 7,372,143 | B2 | 5/2008 | Nakamura et al. | |
| 7,589,390 | B2 | 9/2009 | Yao | |
| 7,648,858 | B2 | 1/2010 | Tang et al. | |
| 7,709,934 | B2 * | 5/2010 | Zeng et al. | 257/659 |
| 7,808,072 | B2 * | 10/2010 | Choi et al. | 257/508 |
| 7,964,972 | B2 * | 6/2011 | Matsui | 257/774 |
| 2003/0071341 | A1 * | 4/2003 | Jeung et al. | 257/686 |
| 2003/0160294 | A1 * | 8/2003 | Wu et al. | 257/459 |
| 2004/0149460 | A1 * | 8/2004 | Powell et al. | 172/145 |
| 2004/0149490 | A1 * | 8/2004 | Chang et al. | 174/266 |
| 2006/0001174 | A1 * | 1/2006 | Matsui | 257/774 |
| 2006/0145350 | A1 | 7/2006 | Gross | |
| 2006/0254808 | A1 | 11/2006 | Farnworth et al. | |
| 2007/0138614 | A1 * | 6/2007 | Harrison et al. | 257/686 |
| 2008/0157294 | A1 * | 7/2008 | Zeng et al. | 257/659 |
| 2008/0179718 | A1 * | 7/2008 | Wu | 257/659 |
| 2008/0272476 | A1 * | 11/2008 | Do et al. | 257/686 |
| 2008/0272477 | A1 | 11/2008 | Do et al. | |

* cited by examiner

SEMICONDUCTOR DIE AND METHOD OF FORMING NOISE ABSORBING REGIONS BETWEEN THVS IN PERIPHERAL REGION OF THE DIE

CLAIM OF DOMESTIC PRIORITY

The present application is a division of U.S. patent application Ser. No. 12/404,069, now U.S. Pat. No. 8,093,151, filed Mar. 13, 2009, and claims priority to the foregoing parent application.

FIELD OF THE INVENTION

The present invention relates in general to semiconductor devices and, more particularly, to a semiconductor die and method of forming noise absorbing regions between conductive through hole vias in a peripheral region around the die.

BACKGROUND OF THE INVENTION

Semiconductor devices are commonly found in modern electronic products. Semiconductor devices vary in the number and density of electrical components. Discrete semiconductor devices generally contain one type of electrical component, e.g., light emitting diode (LED), transistor, resistor, capacitor, inductor, and power metal oxide semiconductor field effect transistor (MOSFET). Integrated semiconductor devices typically contain hundreds to millions of electrical components. Examples of integrated semiconductor devices include microcontrollers, microprocessors, charged-coupled devices (CCDs), solar cells, and digital micro-mirror devices (DMDs).

Semiconductor devices perform a wide range of functions such as high-speed calculations, transmitting and receiving electromagnetic signals, controlling electronic devices, transforming sunlight to electricity, and creating visual projections for television displays. Semiconductor devices are found in the fields of entertainment, communications, power generation, networks, computers, and consumer products. Semiconductor devices are also found in electronic products including military, aviation, automotive, industrial controllers, and office equipment.

Semiconductor devices exploit the electrical properties of semiconductor materials. The atomic structure of semiconductor material allows its electrical conductivity to be manipulated by the application of an electric field or through the process of doping. Doping introduces impurities into the semiconductor material to manipulate and control the conductivity of the semiconductor device.

A semiconductor device contains active and passive electrical structures. Active structures, including transistors, control the flow of electrical current. By varying levels of doping and application of an electric field, the transistor either promotes or restricts the flow of electrical current. Passive structures, including resistors, diodes, and inductors, create a relationship between voltage and current necessary to perform a variety of electrical functions. The passive and active structures are electrically connected to form circuits, which enable the semiconductor device to perform high-speed calculations and other useful functions.

Semiconductor devices are generally manufactured using two complex manufacturing processes, i.e., front-end manufacturing, and back-end manufacturing, each involving potentially hundreds of steps. Front-end manufacturing involves the formation of a plurality of die on the surface of a semiconductor wafer. Each die is typically identical and contains circuits formed by electrically connecting active and passive components. Back-end manufacturing involves singulating individual die from the finished wafer and packaging the die to provide structural support and environmental isolation.

One goal of semiconductor manufacturing is to produce smaller semiconductor devices. Smaller devices typically consume less power, have higher performance, and can be produced more efficiently. In addition, smaller semiconductor devices have a smaller footprint, which is desirable for smaller end products. A smaller die size may be achieved by improvements in the front-end process resulting in die with smaller, higher density active and passive components. Back-end processes may result in semiconductor device packages with a smaller footprint by improvements in electrical interconnection and packaging materials.

Another goal of semiconductor manufacturing is to produce higher performance semiconductor devices. Increases in device performance can be accomplished by forming active components that are capable of operating at higher speeds. In high frequency applications, such as radio frequency (RF) wireless communications, integrated passive devices (IPDs) are often contained within the semiconductor device. Examples of IPDs include resistors, capacitors, and inductors. A typical RF system requires multiple IPDs in one or more semiconductor packages to perform the necessary electrical functions. However, high frequency electrical devices generate or are susceptible to undesired electromagnetic interference (EMI) and radio frequency interference (RFI), or other inter-device interference, such as capacitive, inductive, or conductive coupling, also known as cross-talk, which can interfere with their operation.

The vertical electrical interconnection between stacked semiconductor packages and external devices can be accomplished with conductive through silicon vias (TSV) or through hole vias (THV). The THVs are formed in organic materials in a peripheral region around the device. In RF applications using THVs, the digital and RF signals carried by each THV may cause interference between adjacent THVs. The organic material itself does not provide adequate EMI or RFI isolation. As a result, signal integrity is reduced which can cause signal transmission errors and hinder operation of the die.

SUMMARY OF THE INVENTION

A need exists to isolate semiconductor die from EMI, RFI, and other intra-device interference. Accordingly, in one embodiment, the present invention is a semiconductor device comprising a first semiconductor die with a first surface and a second surface opposite the first surface. A second semiconductor die is laterally separated from the first semiconductor die. An insulating material is disposed between the first and second semiconductor die and extends between a level of the first surface and a level of the second surface. A conductive THV is formed through the insulating material. A conductive layer is formed between the conductive THV and contact pads on the first and second semiconductor die. A noise absorbing material is disposed around the conductive THV to isolate the first and second semiconductor die from intra-device interference.

In another embodiment, the present invention is a semiconductor device comprising a semiconductor die with a first surface and a second surface opposite the first surface. An insulating material is disposed around the semiconductor die and extends between a level of the first surface and a level of the second surface. A conductive THV is formed through the insulating material. A conductive layer is formed between the conductive THV and a contact pad on the first surface of the semiconductor die. A shielding region is disposed around the conductive THV to isolate the semiconductor die from intra-device interference.

In another embodiment, the present invention is a semiconductor device comprising a semiconductor die with a first surface and a second surface opposite the first surface. A conductive THV is laterally separated from the semiconductor die and extends between the first and second surfaces. A conductive layer is formed between the conductive THV and a contact pad of the semiconductor die. A shielding region is formed around the conductive THV to isolate the semiconductor die with respect to interference.

In another embodiment, the present invention is a semiconductor device comprising a semiconductor die. A conductive THV is laterally separated from the semiconductor die. A conductive layer is formed between the conductive THV and a contact pad of the semiconductor die. A shielding material is disposed around the conductive THV to isolate the semiconductor die with respect to interference.

DETAILED DESCRIPTION OF THE DRAWINGS

Figure 1:
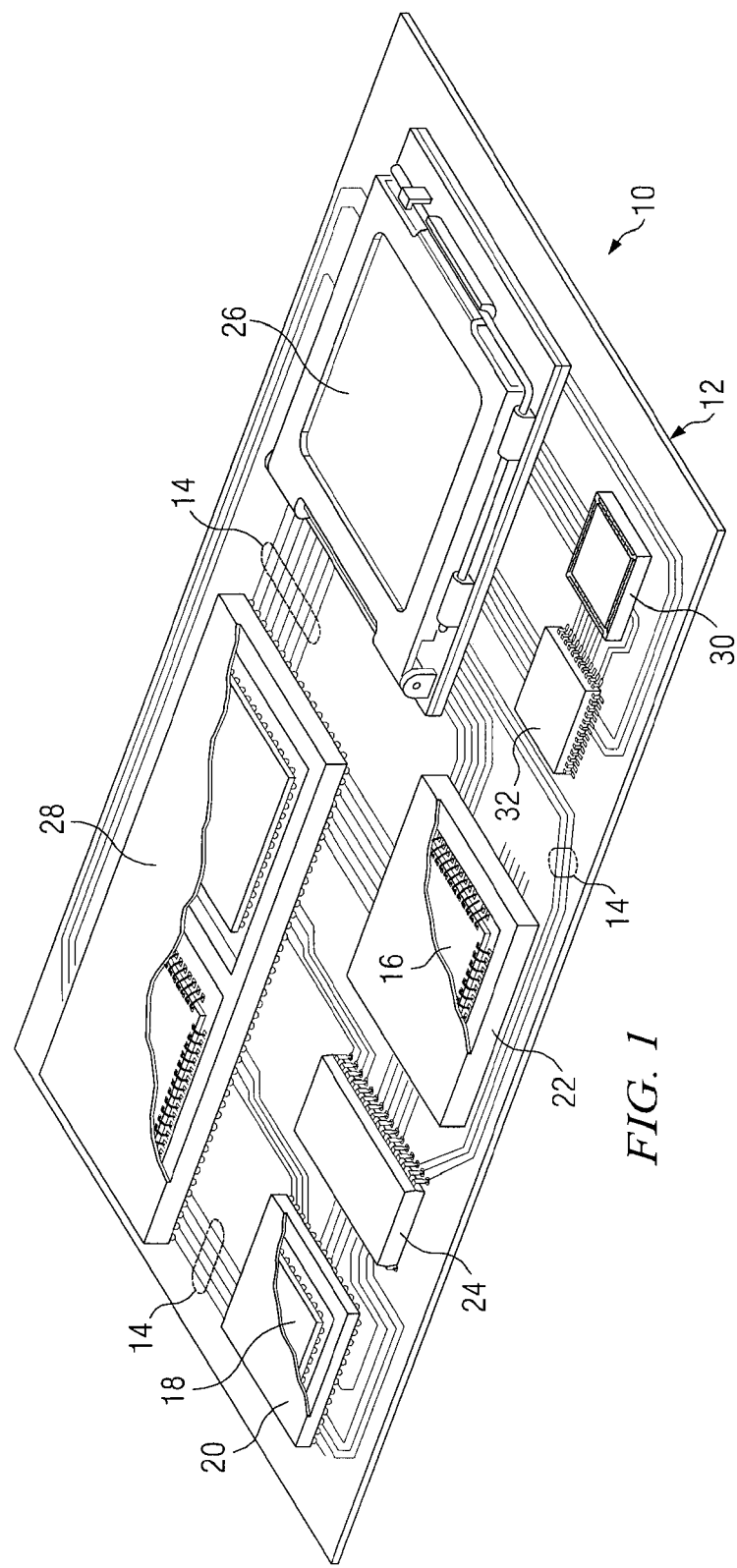
FIG. 1 illustrates a printed circuit board (PCB) with different types of packages mounted to its surface.

The present invention is described in one or more embodiments in the following description with reference to the Figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings.

Semiconductor devices are generally manufactured using two complex manufacturing processes: front-end manufacturing and back-end manufacturing. Front-end manufacturing involves the formation of a plurality of die on the surface of a semiconductor wafer. Each die on the wafer contains active and passive electrical components, which are electrically connected to form functional electrical circuits. Active electrical components, such as transistors, have the ability to control the flow of electrical current. Passive electrical components, such as capacitors, inductors, resistors, and transformers, create a relationship between voltage and current necessary to perform electrical circuit functions.

Passive and active components are formed over the surface of the semiconductor wafer by a series of process steps including doping, deposition, photolithography, etching, and planarization. Doping introduces impurities into the semiconductor material by techniques such as ion implantation or thermal diffusion. The doping process modifies the electrical conductivity of semiconductor material in active devices, transforming the semiconductor material into a permanent insulator, permanent conductor, or changing the semiconductor material conductivity in response to an electric field. Transistors contain regions of varying types and degrees of doping arranged as necessary to enable the transistor to promote or restrict the flow of electrical current upon the application of an electric field.

Active and passive components are formed by layers of materials with different electrical properties. The layers can be formed by a variety of deposition techniques determined in part by the type of material being deposited. For example, thin film deposition may involve chemical vapor deposition (CVD), physical vapor deposition (PVD), electrolytic plating, and electroless plating processes. Each layer is generally patterned to form portions of active components, passive components, or electrical connections between components.

The layers can be patterned using photolithography, which involves the deposition of light sensitive material, e.g., photoresist, over the layer to be patterned. A pattern is transferred from a photomask to the photoresist using light. The portion of the photoresist pattern subjected to light is removed using a solvent, exposing portions of the underlying layer to be patterned. The remainder of the photoresist is removed, leaving behind a patterned layer. Alternatively, some types of materials are patterned by directly depositing the material into the areas or voids formed by a previous deposition/etch process using techniques such as electroless and electrolytic plating.

Depositing a thin film of material over an existing pattern can exaggerate the underlying pattern and create a non-uniformly flat surface. A uniformly flat surface is required to produce smaller and more densely packed active and passive components. Planarization can be used to remove material from the surface of the wafer and produce a uniformly flat surface. Planarization involves polishing the surface of the wafer with a polishing pad. An abrasive material and corrosive chemical are added to the surface of the wafer during polishing. The combined mechanical action of the abrasive and corrosive action of the chemical removes any irregular topography, resulting in a uniformly flat surface.

Back-end manufacturing refers to cutting or singulating the finished wafer into the individual die and then packaging the die for structural support and environmental isolation. To singulate the die, the wafer is scored and broken along non-functional regions of the wafer called saw streets or scribes. The wafer is singulated using a laser cutting device or saw blade. After singulation, the individual die are mounted to a package substrate that includes pins or contact pads for interconnection with other system components. Contact pads formed over the semiconductor die are then connected to contact pads within the package. The electrical connections can be made with solder bumps, stud bumps, conductive paste, or wirebonds. An encapsulant or other molding material is deposited over the package to provide physical support and electrical isolation. The finished package is then inserted into an electrical system and the functionality of the semiconductor device is made available to the other system components.

FIG. 1 illustrates electronic device 10 having a chip carrier substrate or printed circuit board (PCB) 12 with a plurality of semiconductor packages mounted on its surface. Electronic device 10 may have one type of semiconductor package, or multiple types of semiconductor packages, depending on the application. The different types of semiconductor packages are shown in FIG. 1 for purposes of illustration.

Electronic device 10 may be a stand-alone system that uses the semiconductor packages to perform an electrical function. Alternatively, electronic device 10 may be a subcomponent of a larger system. For example, electronic device 10 may be a graphics card, network interface card, or other signal processing card that can be inserted into a computer. The semiconductor package can include microprocessors, memories, application specific integrated circuits (ASICs), logic circuits, analog circuits, RF circuits, discrete devices, or other semiconductor die or electrical components.

In FIG. 1, PCB 12 provides a general substrate for structural support and electrical interconnect of the semiconductor packages mounted on the PCB. Conductive signal traces 14 are formed over a surface or within layers of PCB 12 using evaporation, electrolytic plating, electroless plating, screen printing, PVD, or other suitable metal deposition process. Signal traces 14 provide for electrical communication between each of the semiconductor packages, mounted components, and other external system components. Traces 14 also provide power and ground connections to each of the semiconductor packages.

In some embodiments, a semiconductor device has two packaging levels. First level packaging is a technique for mechanically and electrically attaching the semiconductor die to a carrier. Second level packaging involves mechanically and electrically attaching the carrier to the PCB. In other embodiments, a semiconductor device may only have the first level packaging where the die is mechanically and electrically mounted directly to the PCB.

For the purpose of illustration, several types of first level packaging, including wire bond package 16 and flip chip 18, are shown on PCB 12. Additionally, several types of second level packaging, including ball grid array (BGA) 20, bump chip carrier (BCC) 22, dual in-line package (DIP) 24, land grid array (LGA) 26, multi-chip module (MCM) 28, quad flat non-leaded package (QFN) 30, and quad flat package 32, are shown mounted on PCB 12. Depending upon the system requirements, any combination of semiconductor packages, configured with any combination of first and second level packaging styles, as well as other electronic components, can be connected to PCB 12. In some embodiments, electronic device 10 includes a single attached semiconductor package, while other embodiments call for multiple interconnected packages. By combining one or more semiconductor packages over a single substrate, manufacturers can incorporate pre-made components into electronic devices and systems. Because the semiconductor packages include sophisticated functionality, electronic devices can be manufactured using cheaper components and a streamlined manufacturing process. The resulting devices are less likely to fail and less expensive to manufacture resulting in lower costs for consumers.

Figure 2A:
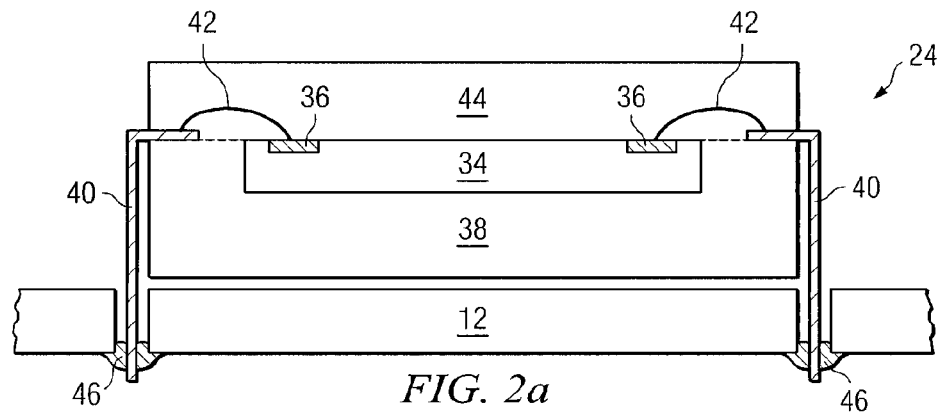
FIGS. 2a-2c illustrate further detail of the representative semiconductor packages mounted to the PCB.

FIG. 2a illustrates further detail of DIP 24 mounted on PCB 12. DIP 24 includes semiconductor die 34 having contact pads 36. Semiconductor die 34 includes an active region containing analog or digital circuits implemented as active devices, passive devices, conductive layers, and dielectric layers formed within semiconductor die 34 and are electrically interconnected according to the electrical design of the die. For example, the circuit may include one or more transistors, diodes, inductors, capacitors, resistors, and other circuit elements formed within the active region of die 34. Contact pads 36 are made with a conductive material, such as aluminum (Al), copper (Cu), tin (Sn), nickel (Ni), gold (Au), or silver (Ag), and are electrically connected to the circuit elements formed within die 34. Contact pads 36 are formed by PVD, CVD, electrolytic plating, or electroless plating process. During assembly of DIP 24, semiconductor die 34 is mounted to a carrier 38 using a gold-silicon eutectic layer or adhesive material such as thermal epoxy. The package body includes an insulative packaging material such as polymer or ceramic. Conductor leads 40 are connected to carrier 38 and wire bonds 42 are formed between leads 40 and contact pads 36 of die 34 as a first level packaging. Encapsulant 44 is deposited over the package for environmental protection by preventing moisture and particles from entering the package and contaminating die 34, contact pads 36, or wire bonds 42. DIP 24 is connected to PCB 12 by inserting leads 40 into holes formed through PCB 12. Solder material 46 is flowed around leads 40 and into the holes to physically and electrically connect DIP 24 to PCB 12. Solder material 46 can be any metal or electrically conductive material, e.g., Sn, lead (Pb), Au, Ag, Cu, zinc (Zn), bismuthinite (Bi), and alloys thereof, with an optional flux material. For example, the solder material can be eutectic Sn/Pb, high-lead, or lead-free.

Figure 2B:
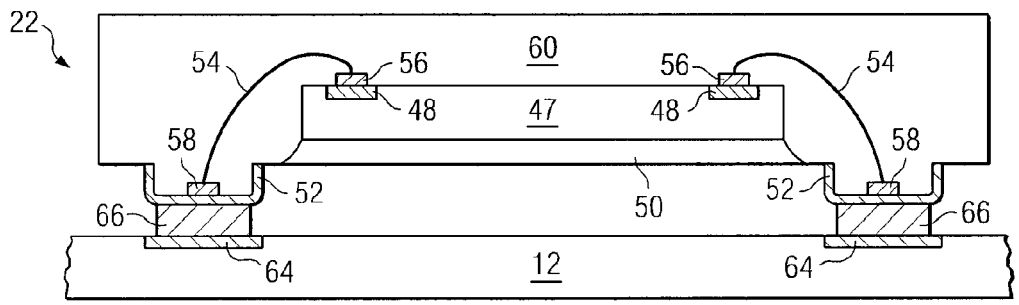

FIG. 2b illustrates further detail of BCC 22 mounted on PCB 12. Semiconductor die 47 is connected to a carrier by wire bond style first level packaging. BCC 22 is mounted to PCB 12 with a BCC style second level packaging. Semiconductor die 47 having contact pads 48 is mounted over a carrier using an underfill or epoxy-resin adhesive material 50. Semiconductor die 47 includes an active region containing analog or digital circuits implemented as active devices, passive devices, conductive layers, and dielectric layers formed within semiconductor die 47 and are electrically interconnected according to the electrical design of the die. For example, the circuit may include one or more transistors, diodes, inductors, capacitors, resistors, and other circuit elements formed within the active region of die 47. Contact pads 48 are made with a conductive material, such as Al, Cu, Sn, Ni, Au, or Ag, and are electrically connected to the circuit elements formed within die 47. Contact pads 48 are formed by PVD, CVD, electrolytic plating, or electroless plating process. Wire bonds 54 and bond pads 56 and 58 electrically connect contact pads 48 of semiconductor die 47 to contact pads 52 of BCC 22 forming the first level packaging. Molding compound or encapsulant 60 is deposited over semiconductor die 47, wire bonds 54, contact pads 48, and contact pads 52 to provide physical support and electrical isolation for the device. Contact pads 64 are formed over a surface of PCB 12 using evaporation, electrolytic plating, electroless plating, screen printing, PVD, or other suitable metal deposition process and are typically plated to prevent oxidation. Contact pads 64 electrically connect to one or more conductive signal traces 14. Solder material is deposited between contact pads 52 of BCC 22 and contact pads 64 of PCB 12. The solder material is reflowed to form bumps 66 which form a mechanical and electrical connection between BCC 22 and PCB 12.

Figure 2C:
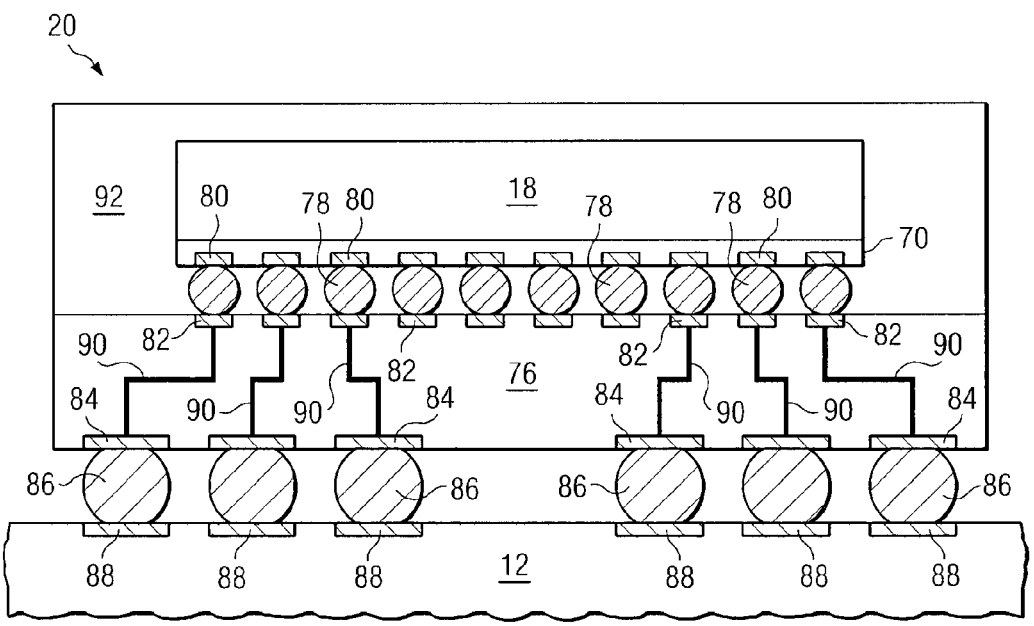

In FIG. 2c, semiconductor die 18 is mounted face down to carrier 76 with a flip chip style first level packaging. BGA 20 is attached to PCB 12 with a BGA style second level packaging. Active region 70 containing analog or digital circuits implemented as active devices, passive devices, conductive layers, and dielectric layers formed within semiconductor die 18 is electrically interconnected according to the electrical design of the die. For example, the circuit may include one or more transistors, diodes, inductors, capacitors, resistors, and other circuit elements formed within active region 70 of semiconductor die 18. Semiconductor die 18 is electrically and mechanically attached to carrier 76 through a large number of individual conductive solder bumps or balls 78. Solder bumps 78 are formed over bump pads or interconnect sites 80, which are disposed on active region 70. Bump pads 80 are made with a conductive material, such as Al, Cu, Sn, Ni, Au, or Ag, and are electrically connected to the circuit elements formed in active region 70. Bump pads 80 are formed by PVD, CVD, electrolytic plating, or electroless plating process. Solder bumps 78 are electrically and mechanically connected to contact pads or interconnect sites 82 on carrier 76 by a solder reflow process.

BGA 20 is electrically and mechanically attached to PCB 12 by a large number of individual conductive solder bumps or balls 86. The solder bumps are formed over bump pads or interconnect sites 84. The bump pads 84 are electrically connected to interconnect sites 82 through conductive lines 90 routed through carrier 76. Contact pads 88 are formed over a surface of PCB 12 using evaporation, electrolytic plating, electroless plating, screen printing, PVD, or other suitable metal deposition process and are typically plated to prevent oxidation. Contact pads 88 electrically connect to one or more conductive signal traces 14. The solder bumps 86 are electrically and mechanically connected to contact pads or bonding pads 88 on PCB 12 by a solder reflow process. Molding compound or encapsulant 92 is deposited over semiconductor die 18 and carrier 76 to provide physical support and electrical isolation for the device. The flip chip semiconductor device provides a short electrical conduction path from the active devices on semiconductor die 18 to conduction tracks on PCB 12 in order to reduce signal propagation distance, lower capacitance, and improve overall circuit performance. In another embodiment, the semiconductor die 18 can be mechanically and electrically attached directly to PCB 12 using flip chip style first level packaging without carrier 76.

Figure 3A:
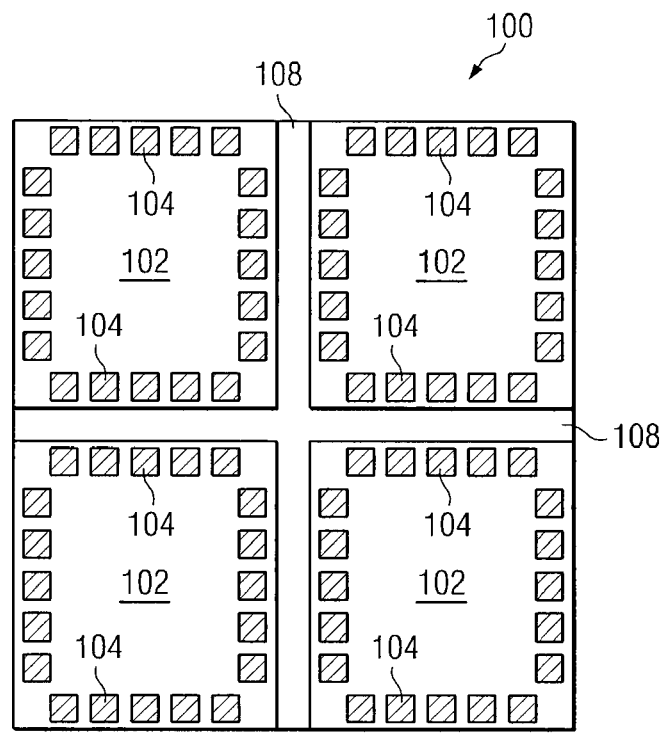
FIGS. 3a-3l illustrate a process of forming through hole vias in a peripheral region of a semiconductor die.
Figure 3B:
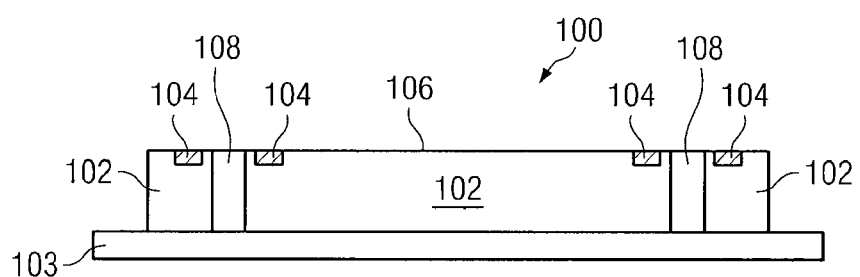

FIGS. 3a-3l illustrate a process of forming conductive vias in a peripheral region around a semiconductor die. To start the process, FIG. 3a shows a plurality of semiconductor die 102 formed on a semiconductor wafer 100 using conventional integrated circuit processes, as described above. Each semiconductor die 102 includes analog or digital circuits implemented as active and passive devices, integrated passive devices (IPD), conductive layers, and dielectric layers formed on topside active surface 106 and electrically interconnected according to the electrical design of the die. For example, the circuit may include one or more transistors, diodes, and other circuit elements formed within active surface 106 to implement baseband digital circuits, such as digital signal processor (DSP), memory, or other signal processing circuit. The semiconductor die 102 may also contain IPD, such as inductors, capacitors, and resistor, for radio frequency (RF) signal processing. Contact pads 104 electrically connect to active and passive devices and signal traces in active area 106 of semiconductor die 102. Semiconductor die 102 are separated by saw street 108. In FIG. 3b, semiconductor wafer 100 is mounted to expansion table 103 with ultraviolet (UV) tape so that contact pads 104 and active surface 106 are oriented face up.

Figure 3C:
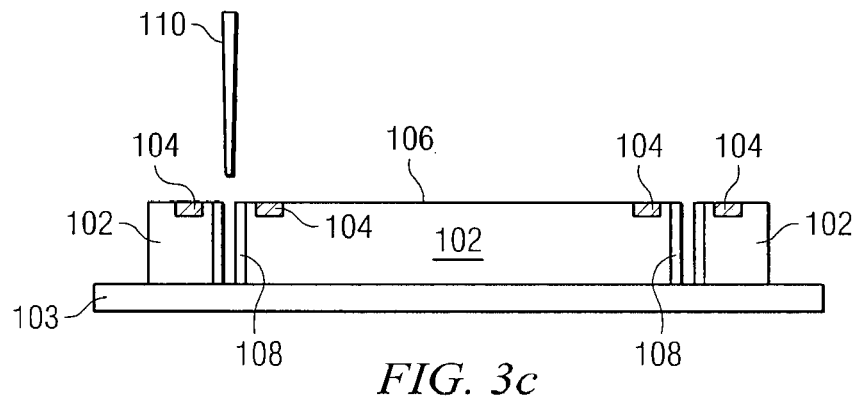
Figure 3D:
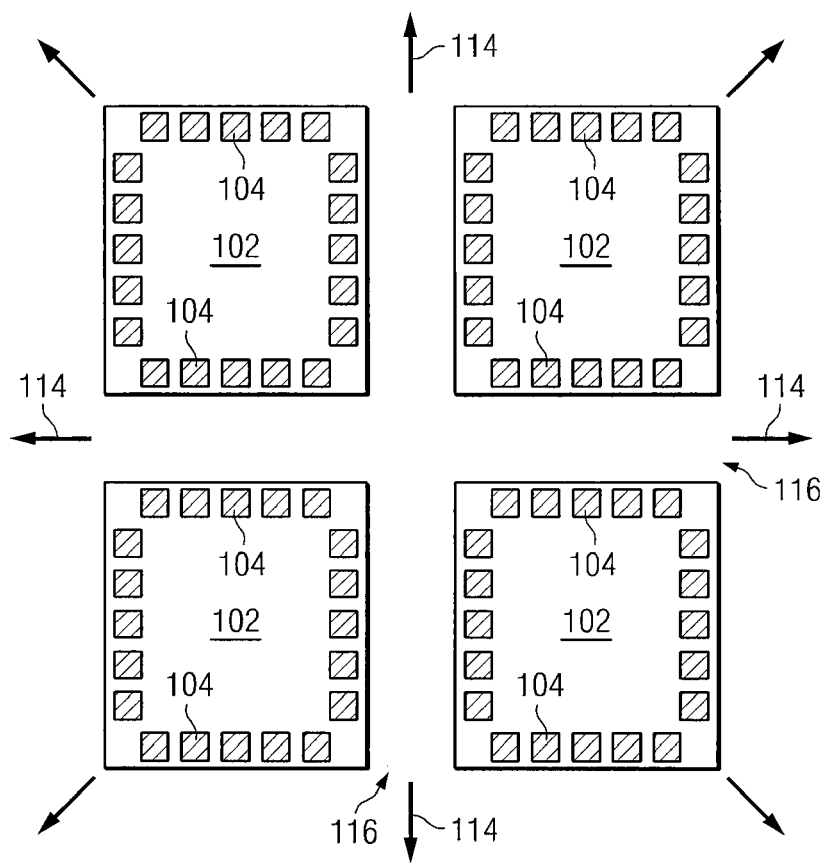

In FIG. 3c, a saw blade or laser tool 110 cuts through saw street 108 down to expansion table 103 in a dicing operation. The saw blade cuts a gap having a width less than the width of saw street 108. In FIG. 3d, expansion table 103 moves in two-dimension lateral directions, as shown by arrows 114, to expand the width of saw street 108, i.e., form a peripheral region 116 and create a greater physical separation between the die. Expansion table 103 moves substantially the same distance in the x-axis and y-axis within the tolerance of the table control to provide separation around a periphery of each die. The post-expansion width of peripheral region 116 ranges from 5-200 μm. The expanded dimension depends on the design embodiment, i.e., half-THV, full-THV, single row via, or double/multiple row via.

In an alternate embodiment, the semiconductor wafer is diced to separate the semiconductor die. The individual semiconductor die are then transferred and affixed to a temporary chip carrier in a pick-and-place operation using an adhesive layer, e.g., thermal epoxy. The semiconductor die are placed on the chip carrier so as to have a predetermined separation or peripheral region. In general, the separation has sufficient width to form conductive vias within the peripheral region, as described below.

Figure 3E:
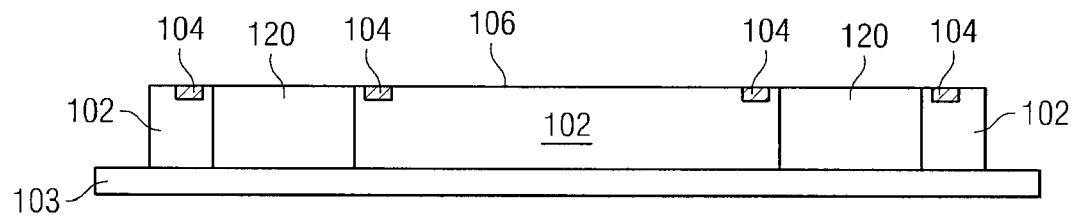
Figure 3F:
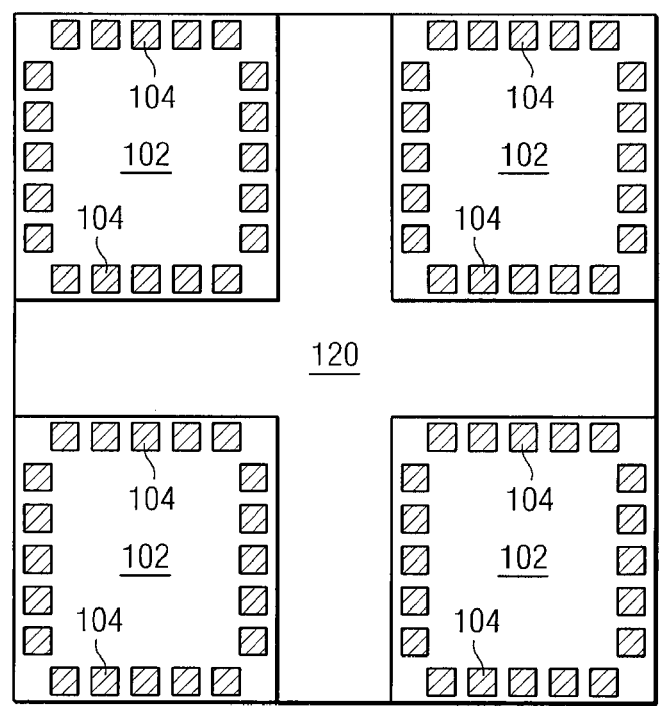

In FIG. 3e, an organic insulating material 120 is deposited in peripheral region 116 using spin coating, needle dispensing, or other suitable application process. FIG. 3f is a top view of organic insulating material 120 deposited in peripheral region 116. Organic material 120 can be benzocyclobutene (BCB), polyimide (PI), or acrylic resin. Alternatively, other non-conductive materials such as a polymer molding compound, liquid epoxy molding, compression molding, soft laminating film, or other material having dielectric or electrical insulating properties can be deposited in peripheral region 116. The non-conductive materials can also be deposited using a transfer molding or injection molding process.

Figure 3G:
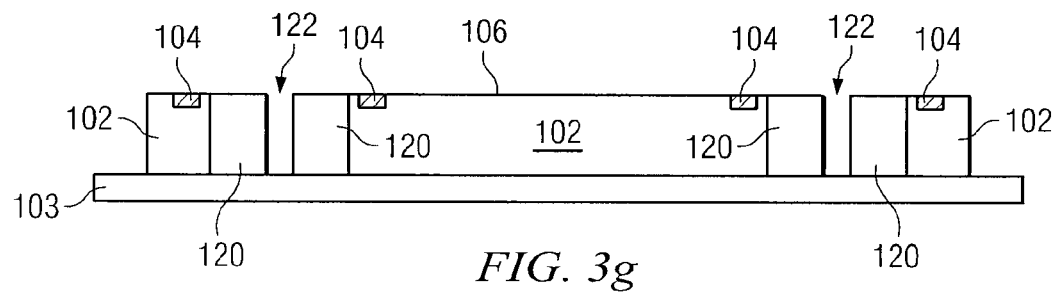
Figure 3H:
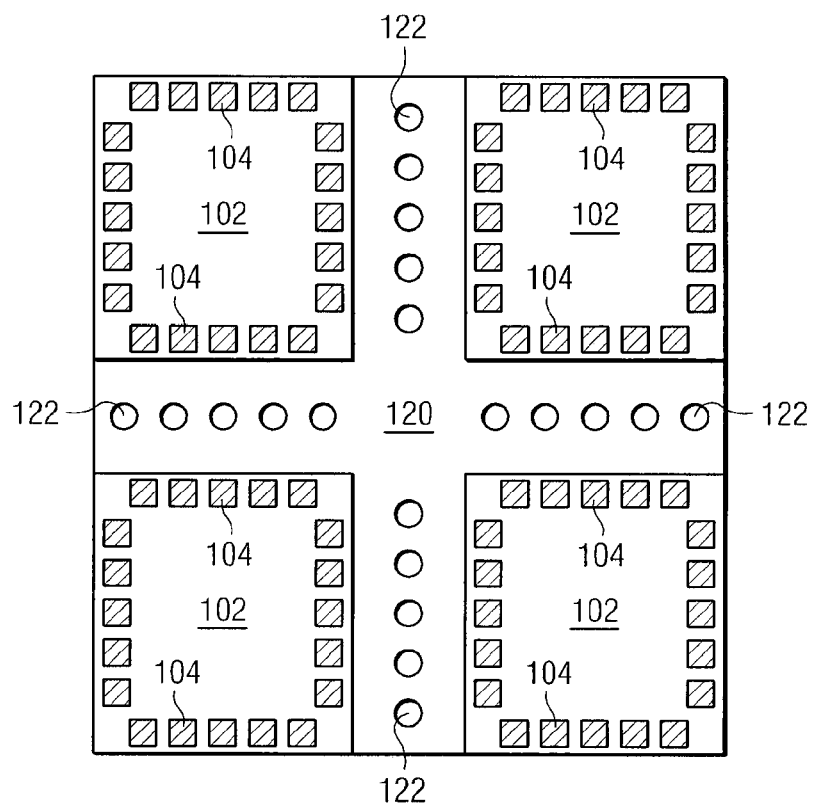

In FIG. 3g, a portion of organic material 118 is removed by laser drilling or deep reactive ion etching (DRIE) to create openings or holes 122 that extends down to expansion table 103. The openings 122 extend completely through the peripheral region from one side of the semiconductor die to its opposite side. FIG. 3h shows a top view of openings 122. The sidewalls of openings 122 can be vertical or tapered.

Figure 3I:
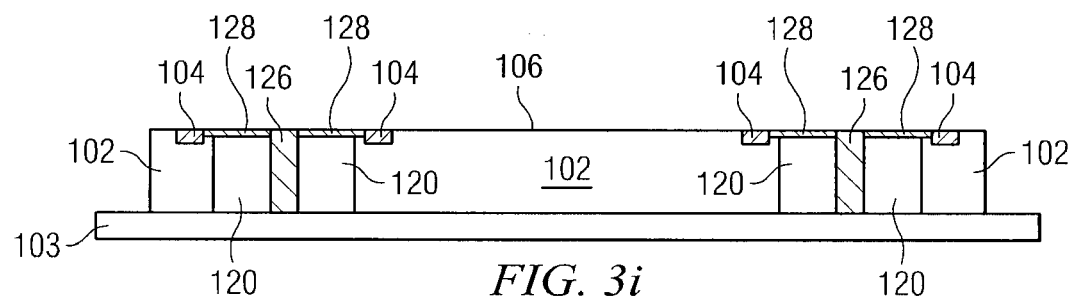
Figure 3J:
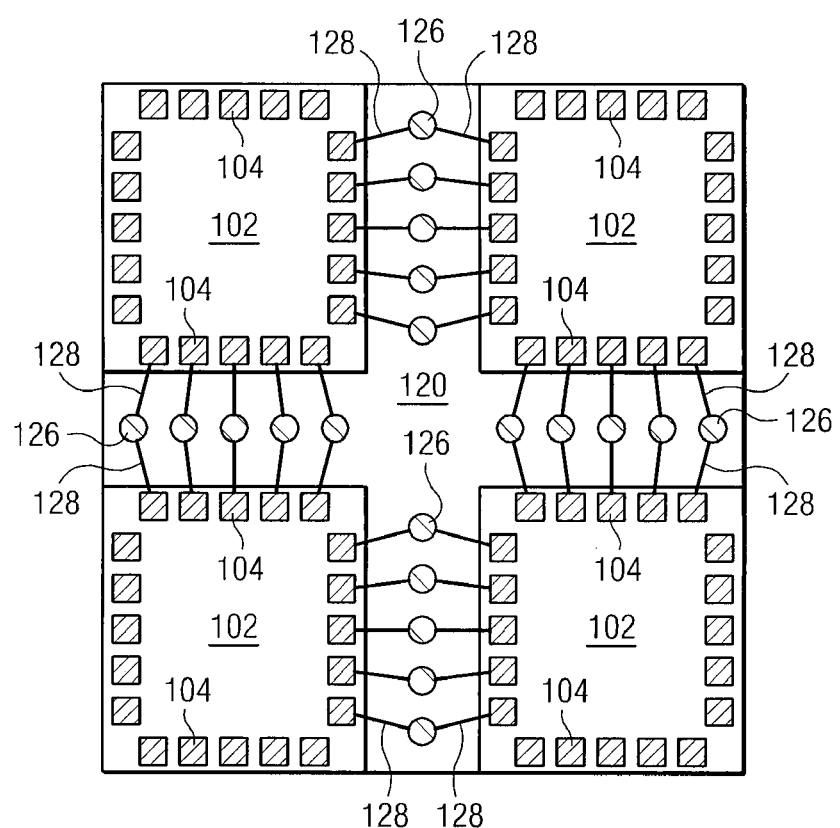

In FIG. 3i, an electrically conductive material 126 is deposited into openings 122 using PVD, CVD, evaporation, electrolytic plating, electroless plating, screen printing, or other suitable metal deposition process. An electrically conductive material 128 is patterned and deposited over organic material 120 using PVD, CVD, evaporation, electrolytic plating, electroless plating, screen printing, or other suitable metal deposition process. An optional passivation layer can be deposited over semiconductor wafer 100 to isolate conductive layer 128 from active surface 106. The passivation layer can be one or more layers of silicon dioxide (SiO2), silicon nitride (Si3N4), silicon oxynitride (SiON), tantalum pentoxide (Ta2O5), aluminum oxide (Al2O3), or other material having similar insulating and structural properties. The insulating layer is deposited using PVD, CVD, printing, spin coating, spray coating, sintering or thermal oxidation. A portion of passivation layer is removed by an etching process to expose contact pads 104. The conductive layer 128 forms signal traces or redistribution layers (RDL) to electrically connect contact pads 104 to conductive material 126, as shown in FIG. 3j. The conductive material 126 and conductive layer 128 can be one or more layers of Al, Cu, Sn, Ni, Au, Ag, or other suitable electrically conductive material.

Figure 3K:
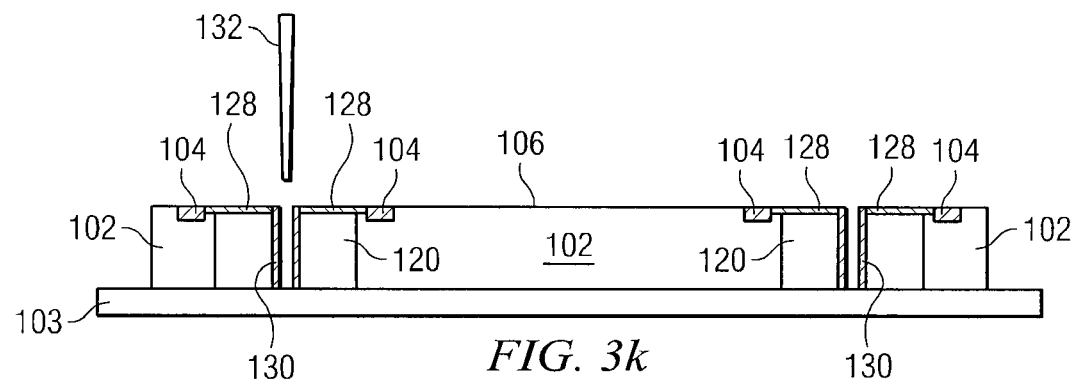
Figure 3L:
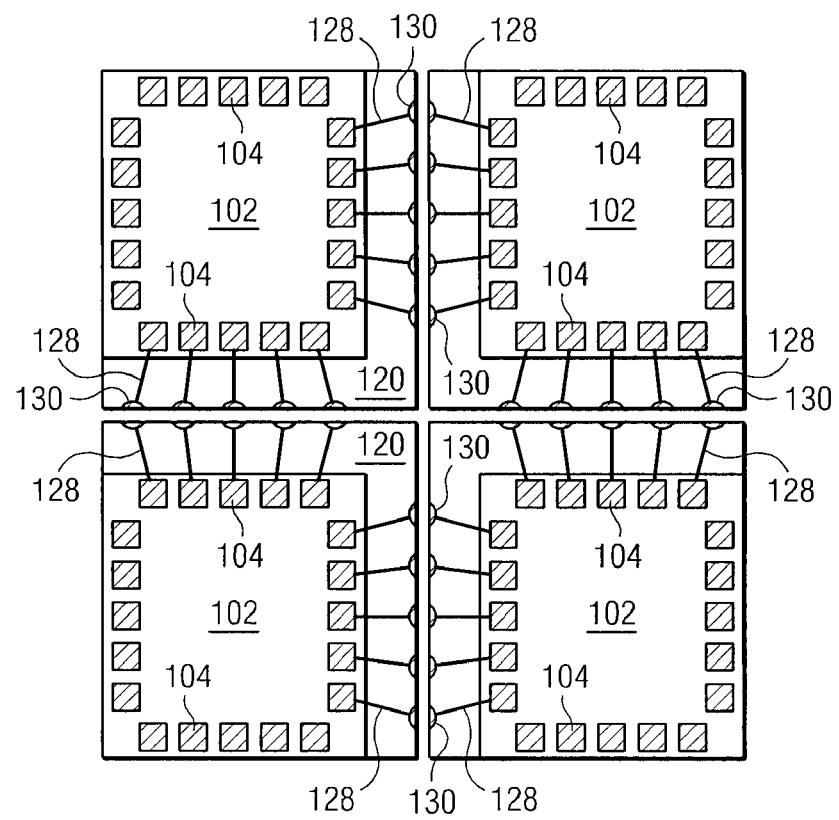

In FIG. 3k, semiconductor die 102 are singulated through a center portion of peripheral region 116, i.e., to bisect conductive material 128 and create conductive through hole vias (THV) 130. The peripheral region 116 is cut by a cutting tool 132 such as a saw blade or laser. By cutting through the center of conductive material 126, THVs 130 are conductive half-vias which provide an electrical connection from one side of semiconductor die 102 to the opposite side of the die. The cutting tool completely severs the peripheral region to separate the die. FIG. 3l shows a top view of THVs 130. The semiconductor die are removed from expansion table 103.

The process flow of FIGS. 3a-3l may also use a reconfigured wafer technique involving the attachment of a plurality of semiconductor die on a temporary carrier. An encapsulant is deposited over the semiconductor die. Conductive via are formed through vias in the encapsulant. The carrier is debonded and RDLs are formed between contact pads on the semiconductor die and conductive vias. An interconnect structure such as solder bumps are formed and the wafer is singulated into individual semiconductor die.

Figure 4:
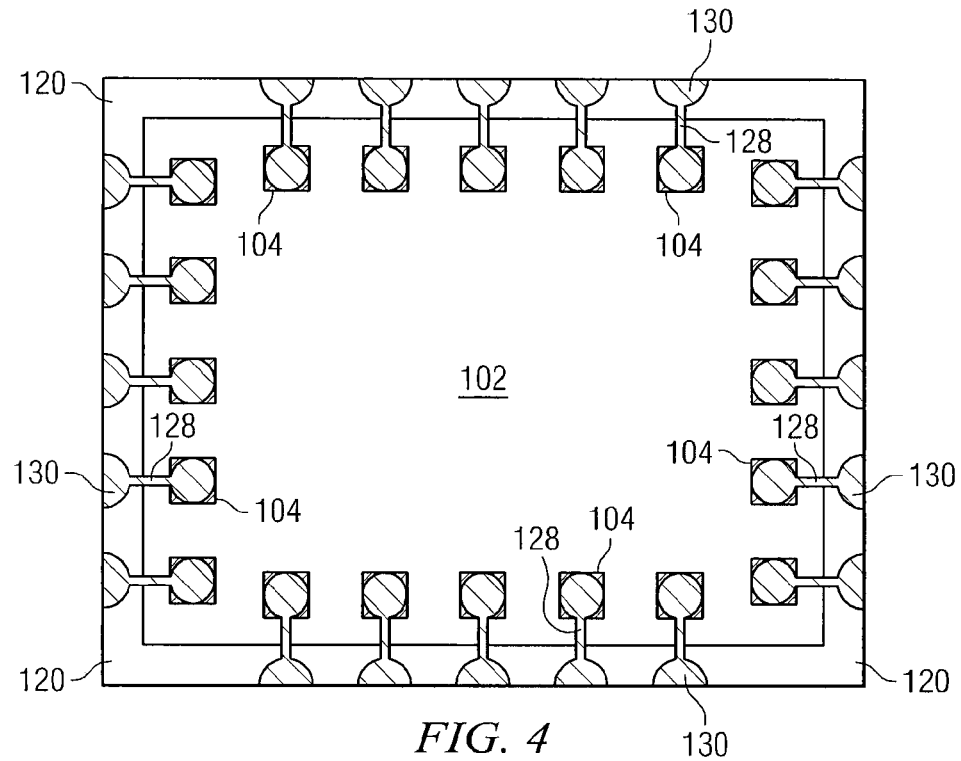
FIG. 4 illustrates a top view of conductive half-THVs formed in a peripheral region of the semiconductor die.

FIG. 4 shows a final configuration for semiconductor die 102 with conductive THVs 130 formed in a peripheral region of the die to provide an electrical connection from one side of each die to the opposite side of the die. Conductive THVs 130 electrically connect through RDLs 128 to contact pads 104, as well as to active and passive devices and signal traces in active area 106 of semiconductor die 102.

Figure 5:
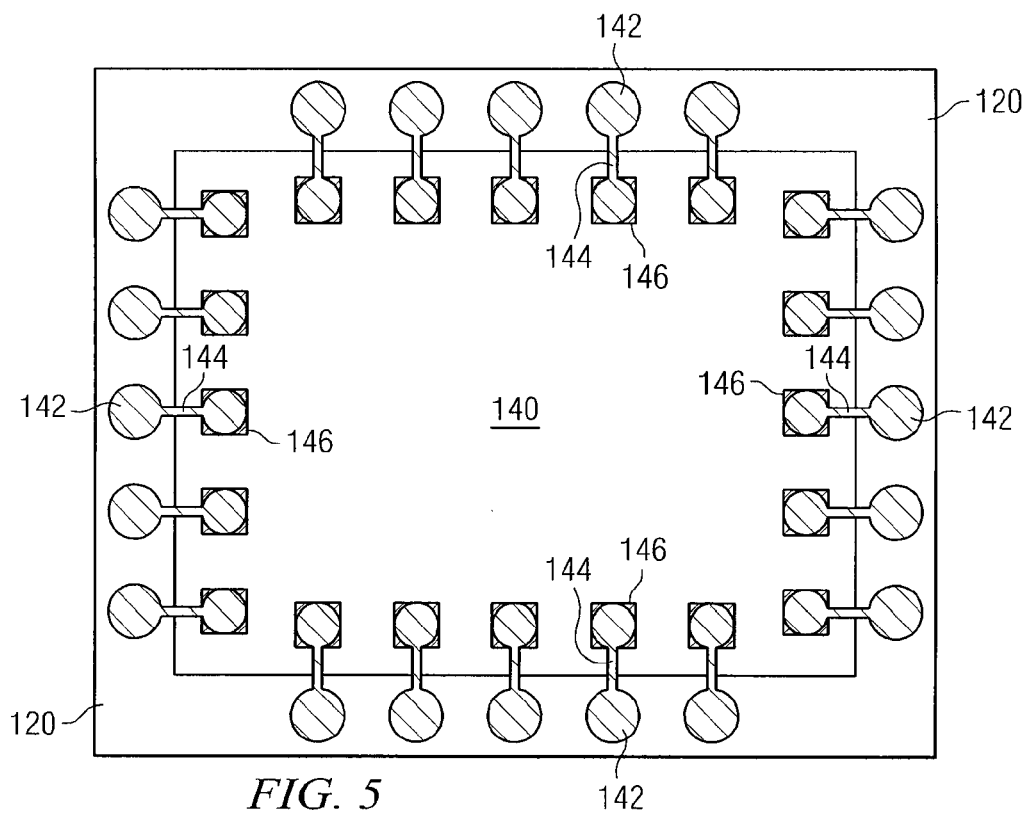
FIG. 5 illustrates a top view of conductive full-THVs formed in a peripheral region of the semiconductor die.

FIG. 5 shows semiconductor die 140 with conductive full-THVs 142 formed in a peripheral region of the die to provide an electrical connection from one side of each die to the opposite side of the die. To form full-THVs 142, the peripheral region is made sufficiently wide to form two side-by-side conductive regions like 126 in FIG. 3i. The peripheral region is filled with organic material like 120 and the two conductive regions are formed separated by the organic material in the peripheral region. The cutting tool severs the organic material between the two conductive vias to provide full-THVs 142. RDLs 144 are formed similar to RDLs 128 in FIG. 3j. Conductive THVs 142 electrically connect through RDLs 144 to contact pads 146 of semiconductor die 140.

Figure 6:
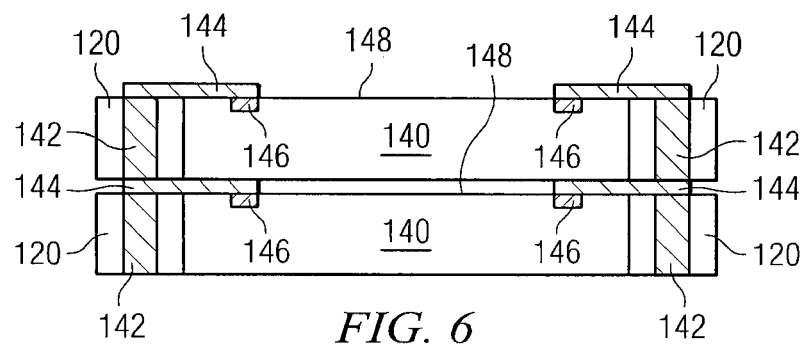
FIG. 6 illustrates stacked semiconductor die with conductive THVs.

FIG. 6 shows two stacked semiconductor die 140 electrically interconnected in the vertical (z) direction through conductive THVs 142. The active and passive devices and signal traces in active area 148 of each semiconductor die 140 electrically connect through contact pads 146, RDL 144, and conductive THVs 142.

Figure 7:
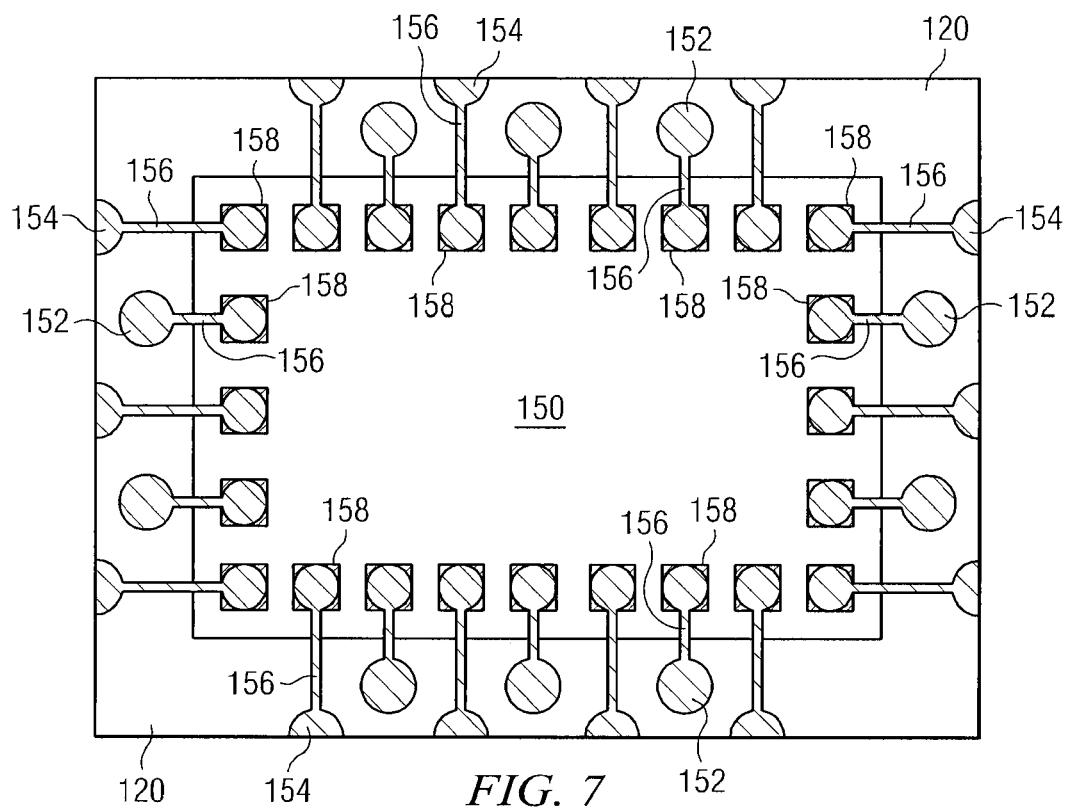
FIG. 7 illustrates a top view of conductive full-THVs and conductive half-THVs formed as multiple offset rows in a peripheral region of the semiconductor die.

FIG. 7 shows semiconductor die 150 with conductive full-THVs 152 and conductive half-THVs 154 formed on multiple offset rows in a peripheral region around the die to provide an electrical connection from one side of each die to the other side of the die. To form full-THVs 152 and half-THVs 154, the peripheral region is made sufficiently wide to form three conductive regions, like 126 in FIG. 3i, in multiple offset rows. The peripheral region is filled with organic material like 120 and the conductive regions are formed separated by the organic material in the peripheral region. The cutting tool severs the middle conductive via to provide one full-THV 152 and one half-THV 154 in the peripheral region of each semiconductor die 150. RDLs 156 are formed similar to RDLs 128 in FIG. 3j. Conductive THVs 152-154 electrically connect through RDLs 156 to contact pads 158, as well as to active and passive devices and signal traces in the active area of semiconductor die 150.

Semiconductor die 102, 140, and 150 may each contain baseband circuits that are susceptible to EMI, RFI, or other interference, such as capacitive, inductive, or conductive coupling. In other embodiments, semiconductor die 102, 140, and 150 contain integrated passive devices (IPD) that generate EMI, RFI, and other interference. For example, the IPDs contained within semiconductor die 102, 140, and 150 provide the electrical characteristics needed for high frequency applications, such as resonators, high-pass filters, low-pass filters, band-pass filters, symmetric Hi-Q resonant transformers, and tuning capacitors. The IPDs can be used as front-end wireless RF components, which can be positioned between the antenna and transceiver. The IPD inductor can be a hi-Q balun, transformer, or coil, operating up to 100 Gigahertz. In some applications, multiple baluns are formed on a same substrate, allowing multi-band operation. For example, two or more baluns are used in a quad-band for mobile phones or other global system for mobile (GSM) communications, each balun is dedicated for a frequency band of operation of the quad-band device. A typical RF system requires multiple IPDs and other high frequency circuits in one or more semiconductor packages to perform the necessary electrical functions.

Figure 8:
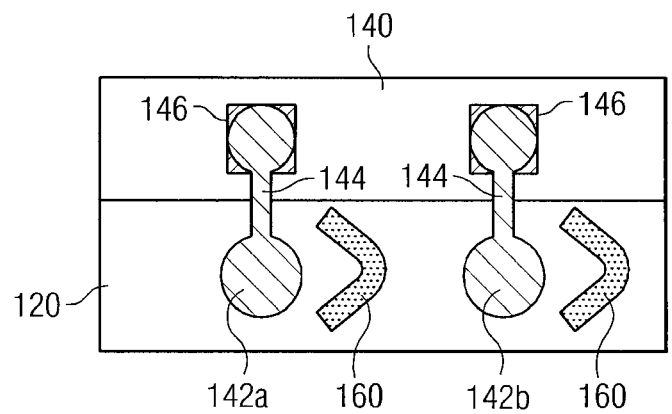
FIG. 8 illustrates a top view of noise absorbing regions formed between conductive THVs in a peripheral region of the semiconductor die.

FIG. 8 shows further detail of the peripheral region around semiconductor die 140, THVs 142, and RDL 144 from FIG. 5. In one embodiment, one THV 142a may carry a digital signal switching at a high rate. An adjacent THV 142b carries an RF signal, which is susceptible to EMI and RFI. The high frequency switching of the digital on THV 142a could induce EMI and RFI noise and adversely affect the RF signal on the adjacent THV 142b.

Figure 9:
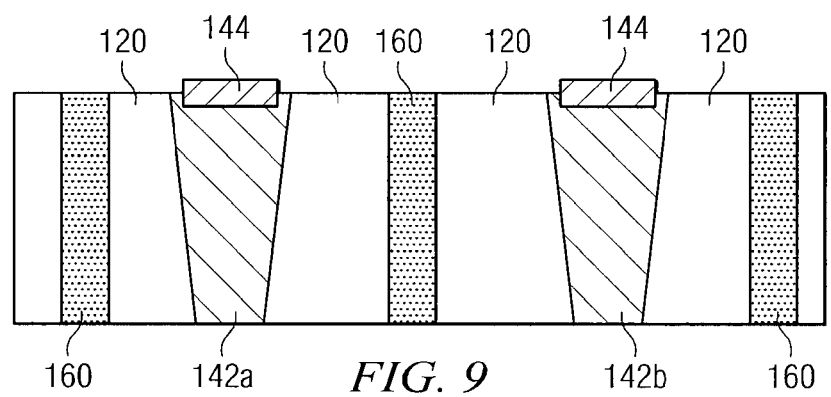
FIG. 9 illustrates a cross-sectional view of the noise absorbing regions formed between conductive THVs in a peripheral region of the semiconductor die.

To reduce the effects of intra-device EMI and RFI within semiconductor die 140, a noise absorbing or shielding region 160 is implanted or formed in organic material 120 in the peripheral region between conductive THVS 142a and 142b of semiconductor die 140. Shielding region 160 is typically formed prior to singulation. In one embodiment, shielding region 160 is formed as organic material 120 is deposited. Alternatively, shielding region 160 is implanted after organic material 120 is deposited, e.g. after the conductive THVs are formed. The EMI/RFI shielding region 160 has an angular, semi-circular, rectangular, or other geometric shape. FIG. 9 is a cross-sectional view of shielding region 160 extending through the peripheral region of semiconductor die 140 to shield adjacent conductive THVs 142a and 142b from intra-device EMI and RFI. Shielding region 160 is connected to a low-impedance ground point on a substrate or printed circuit board (PCB) to provide a discharge path for the EMI/RFI energy.

Shielding region 160 can be a dielectric material such as carbon-black or aluminum flake to reduce the effects of EMI and RFI. Alternatively, shielding region 160 can be soft-magnetic materials such as ferrite or carbonyl iron, Cu, Al, stainless steel, nickel silver, low-carbon steel, silicon-iron steel, foil, epoxy, conductive resin, and other metals and composites capable of blocking or absorbing EMI, RFI, and other interference.

Figure 10:
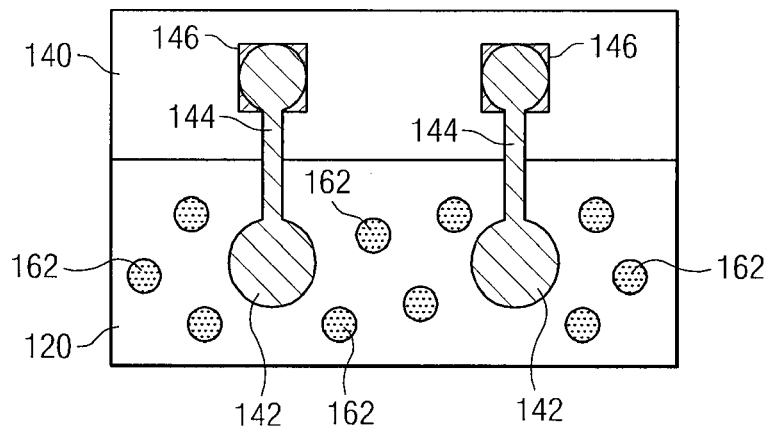
FIG. 10 illustrates a noise absorbing material dispersed between conductive THVs in a peripheral region of the semiconductor die.

In an alternate embodiment, EMI/RFI noise absorbing or shielding material 162 is implanted or deposited between and around conductive THVs 142 in dispersed configuration, as shown in FIG. 10. The dispersed configuration may either be through holes filled with noise absorbing or shielding materials or in granular particulates implanted in organic material 120. Shielding material 162 can be a dielectric material such as carbon-black or aluminum flake to reduce the effects of EMI and RFI. Alternatively, shielding material 162 can be soft-magnetic materials such as ferrite or carbonyl iron, Cu, Al, stainless steel, nickel silver, low-carbon steel, silicon-iron steel, foil, epoxy, conductive resin, and other metals and composites capable of blocking or absorbing EMI, RFI, and other intra-device interference.

Figure 11:
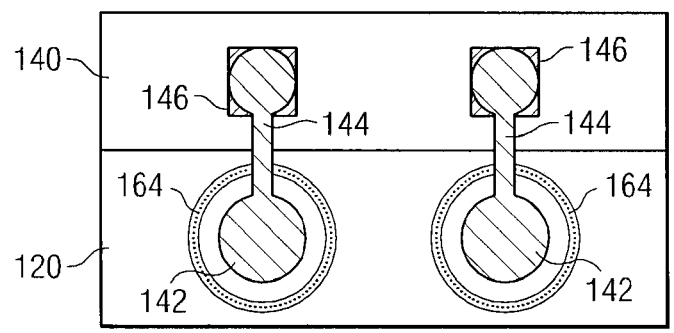
FIG. 11 illustrates a noise absorbing region formed around each conductive full-THV in a peripheral region of the semiconductor die.

FIG. 11 shows noise absorbing or shielding region 164 implanted or deposited in organic material 120 in the peripheral region between semiconductor die 140. In this embodiment, the EMI/RFI shielding region 164 is circular and implanted or deposited around conductive THVs 142. Shielding region 164 extends through the peripheral region of semiconductor die 140 to shield adjacent conductive THVs 142 from intra-device EMI and RFI. Shielding region 164 is connected to a low-impedance ground point on a substrate or PCB to provide a discharge path for the EMI/RFI energy.

Shielding region 164 can be a dielectric material such as carbon-black or aluminum flake to reduce the effects of EMI and RFI. Alternatively, shielding region 164 can be soft-magnetic materials such as ferrite or carbonyl iron, Cu, Al, stainless steel, nickel silver, low-carbon steel, silicon-iron steel, foil, epoxy, conductive resin, and other metals and composites capable of blocking or absorbing EMI, RFI, and other intra-device interference.

Figure 12:
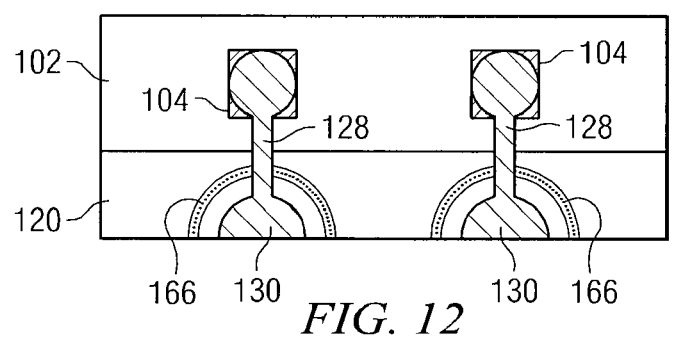
FIG. 12 illustrates a noise absorbing region formed around each conductive half-THV in a peripheral region of the semiconductor die.

FIG. 12 shows noise absorbing or shielding region 166 implanted or deposited in organic material 120 in the peripheral region between semiconductor die 102. In this embodiment, the EMI/RFI shielding region 166 is semi-circular and implanted or deposited around conductive THVs 130. Shielding region 166 extends through the peripheral region of semiconductor die 102 to shield adjacent conductive THVs 130 from intra-device EMI and RFI. Shielding region 166 is connected to a low-impedance ground point on a substrate or PCB to provide a discharge path for the EMI/RFI energy.

Figure 13:
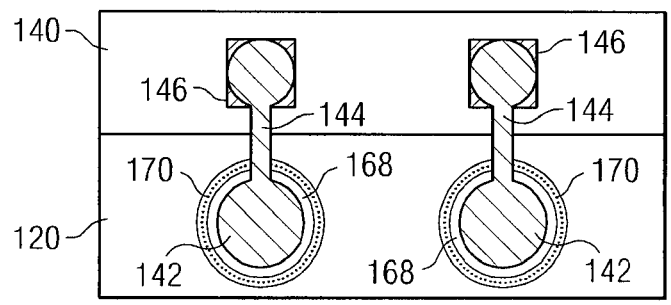
FIG. 13 illustrates a barrier layer between the noise absorbing region and conductive THV in a peripheral region of the semiconductor die.

FIG. 13 shows barrier layer 168 formed around conductive THVs 142. A noise absorbing or shielding region 170 is formed around barrier layer 168. After openings 122 are formed, see FIG. 3g, shielding region 170 is formed on the inner surface of the cavity. Barrier layer 168 is formed over shielding region 170. In one embodiment barrier layer 168 can be one or more layers of an insulating material such as SiO2, Si3N4, SiON, Ta2O5, zircon (ZrO2), Al2O3, polyimide, BCB, polybenzoxazoles (PBO), or other material having similar insulating and structural properties. Barrier layer 168 is deposited using PVD, CVD, printing, spin coating, spray coating, sintering or thermal oxidation. The remaining portion of openings 122 is filled with conductive material to form conductive THVs 142. Shielding region 170 extends through the peripheral region of semiconductor die 140 to shield adjacent conductive THVs 142 from intra-device EMI and RFI. Shielding region 170 is connected to a low-impedance ground point on a substrate or PCB to provide a discharge path for the EMI/RFI energy.

Shielding region 170 can be a dielectric material such as carbon-black or aluminum flake to reduce the effects of EMI and RFI. Alternatively, shielding region 170 can be soft-magnetic materials such as ferrite or carbonyl iron, Cu, Al, stainless steel, nickel silver, low-carbon steel, silicon-iron steel, foil, epoxy, conductive resin, and other metals and composites capable of blocking or absorbing EMI, RFI, and other intra-device interference.

Figure 14:
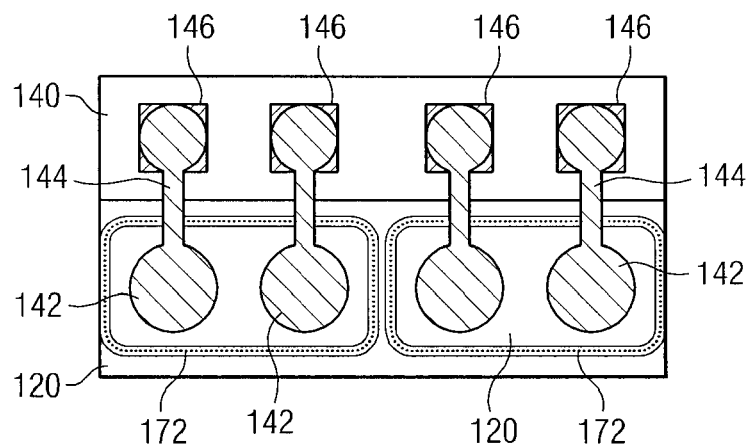
FIG. 14 illustrates a noise absorbing region formed around multiple conductive THVs in a peripheral region of the semiconductor die.

FIG. 14 shows noise absorbing or shielding region 172 implanted or deposited in organic material 120 in the peripheral region between semiconductor die 140. In this embodiment, each EMI/RFI shielding region 172 is oval or rectangular and implanted or deposited around two or more conductive THVs 142. Shielding region 172 extends through the peripheral region of semiconductor die 140 to shield adjacent conductive THVs 142 from intra-device EMI and RFI. Shielding region 172 is connected to a low-impedance ground point on a substrate or PCB to provide a discharge path for the EMI/RFI energy.

Shielding region 172 can be a dielectric material such as carbon-black or aluminum flake to reduce the effects of EMI and RFI. Alternatively, shielding region 172 can be soft-magnetic materials such as ferrite or carbonyl iron, Cu, Al, stainless steel, nickel silver, low-carbon steel, silicon-iron steel, foil, epoxy, conductive resin, and other metals and composites capable of blocking or absorbing EMI, RFI, and other intra-device interference.

Figure 15:
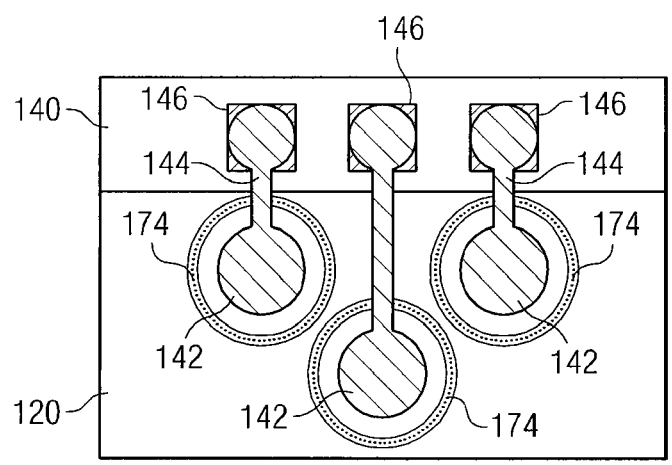
FIG. 15 illustrates a noise absorbing region formed around each conductive full-THV in multiple offset rows in a peripheral region of the semiconductor die.

FIG. 15 shows noise absorbing or shielding region 174 implanted or deposited in organic material 120 in the peripheral region between semiconductor die 140. In this embodiment, the EMI/RFI shielding region 174 is circular and implanted or deposited around offset or multiple rows of conductive THVs 142 for higher density I/O. Shielding region 174 extends through the peripheral region of semiconductor die 140 to shield adjacent conductive THVs 142 from intra-device EMI and RFI. Shielding region 174 is connected to a low-impedance ground point on a substrate or PCB to provide a discharge path for the EMI/RFI energy.

Shielding region 174 can be a dielectric material such as carbon-black or aluminum flake to reduce the effects of EMI and RFI. Alternatively, shielding region 174 can be soft-magnetic materials such as ferrite or carbonyl iron, Cu, Al, stainless steel, nickel silver, low-carbon steel, silicon-iron steel, foil, epoxy, conductive resin, and other metals and composites capable of blocking or absorbing EMI, RFI, and other intra-device interference.

While one or more embodiments of the present invention have been illustrated in detail, the skilled artisan will appreciate that modifications and adaptations to those embodiments may be made without departing from the scope of the present invention as set forth in the following claims.

What is claimed:

1. A semiconductor device, comprising:
   a first semiconductor die including a first surface and a second surface opposite the first surface;
   a second semiconductor die laterally separated from the first semiconductor die;
   an insulating material disposed between the first and second semiconductor die and extending between a level of the first surface and a level of the second surface;
   a conductive via formed through the insulating material disposed between the first and second semiconductor die;
   a conductive layer extending from the conductive via to the first semiconductor die; and
   a plurality of electromagnetic interference (EMI) shielding particles dispersed within the insulating material around the conductive via between the level of the first surface and the level of the second surface, each EMI shielding particle being separated from the conductive via by the insulating material.

2. The semiconductor device of claim 1, further including a plurality of conductive vias with the EMI shielding particles dispersed between the plurality of conductive vias.

3. The semiconductor device of claim 1, further including a barrier layer formed between the EMI shielding particles and conductive via.

4. A semiconductor device, comprising:
a semiconductor die including a first surface and a second surface opposite the first surface;
an insulating material disposed completely around the semiconductor die and extending between a level of the first surface and a level of the second surface;
a conductive via formed through the insulating material and extending between the level of the first surface and the level of the second surface; and
a shielding region disposed around the conductive via and extending through the insulating material between the level of the first surface and the level of the second surface, wherein the shielding region is physically separated from the conductive via by the insulating material.

5. The semiconductor device of claim 4, wherein the shielding region has an angular, semi-circular, or rectangular shape.

6. The semiconductor device of claim 4, wherein the shielding region includes a plurality of electromagnetic interference (EMI) shielding particles dispersed within the insulating material around the conductive via.

7. The semiconductor device of claim 4, further including the shielding region formed completely around the conductive via.

8. The semiconductor device of claim 4, further including a barrier layer disposed between the shielding region and conductive via.

9. The semiconductor device of claim 4, further including a plurality of conductive vias, wherein the shielding region is formed around the plurality of conductive vias.

10. A semiconductor device, comprising:
a semiconductor die;
an insulating material disposed in a peripheral region around the semiconductor die;
a conductive via formed through the insulating material in the peripheral region around the semiconductor die; and
a shielding region extending through the insulating material, wherein the shielding region is separated from the conductive via by the insulating material.

11. The semiconductor device of claim 10, wherein the shielding region has an angular, semi-circular, or rectangular shape.

12. The semiconductor device of claim 10, further including a plurality of conductive vias with the shielding region formed between the plurality of conductive vias.

13. The semiconductor device of claim 10, further including the shielding region formed completely around the conductive via.

14. The semiconductor device of claim 10, wherein the shield region includes a plurality of electromagnetic interference (EMI) shielding particles dispersed within the insulating material around the conductive via.

15. The semiconductor device of claim 10, further including a barrier layer formed between the shielding region and conductive via.

16. A semiconductor device, comprising:
a semiconductor die;
an insulating material disposed in a peripheral region around the semiconductor die;
a conductive via formed through the insulating material and laterally separated from the semiconductor die;
a conductive layer extends from the conductive via to a contact pad on a surface of the semiconductor die; and
a shielding material extending through the insulating material and disposed outside a footprint of the semiconductor die to shield the conductive via.

17. The semiconductor device of claim 16, wherein the shielding material extends from a first side of the semiconductor die to a second side of the semiconductor die opposite the first side.

18. The semiconductor device of claim 16, wherein the shielding material has an angular, semi-circular, or rectangular shape.

19. The semiconductor device of claim 16, wherein the shield material includes a plurality of electromagnetic interference (EMI) shielding particles dispersed within the insulating material around the conductive via.

20. The semiconductor device of claim 16, further including the shielding material formed completely around the conductive via.

21. The semiconductor device of claim 16, further including a barrier layer formed between the shielding material and conductive via.

22. A semiconductor device, comprising:
a semiconductor die including an active surface, a back surface, and a side surface;
an insulating material formed around the side surface of the semiconductor die;
a conductive via formed through the insulating material; and
a shielding material disposed around the conductive via and extending through the insulating material to shield the conductive via, wherein the shielding region is separated from the conductive via by the insulating material.

23. The semiconductor device of claim 22, wherein the shielding material extends from the active surface of the semiconductor die to the back surface of the semiconductor die opposite the active surface.

24. The semiconductor device of claim 22, wherein the shielding material has an angular, semi-circular, or rectangular shape.

25. The semiconductor device of claim 22, wherein the shield material includes a plurality of electromagnetic interference (EMI) shielding particles dispersed within the insulating material around the conductive via.

26. The semiconductor device of claim 22, further including the shielding material formed completely around the conductive via.

27. The semiconductor device of claim 22, further including a barrier layer formed between the shielding material and conductive via.

28. The semiconductor device of claim 22, wherein the shielding material is disposed between the semiconductor die and the conductive via.

29. The semiconductor device of claim 1, wherein the EMI shielding particles are disposed between the first semiconductor die and the conductive via.

30. The semiconductor device of claim 4, wherein the shielding region is disposed between the semiconductor die and the conductive via.

31. The semiconductor device of claim 10, wherein the shielding region is formed between the semiconductor die and the conductive via.

32. The semiconductor device of claim 16, wherein the shielding material is disposed between the semiconductor die and the conductive via.

* * * * *